United States Patent
Saifuddin et al.

(10) Patent No.: US 9,824,742 B1
(45) Date of Patent: Nov. 21, 2017

(54) DRAM ACCESS IN SELF-REFRESH STATE

(71) Applicant: QUALCOMM Incorporated, San Diego, CA (US)

(72) Inventors: Mosaddiq Saifuddin, San Diego, CA (US); SankaraRao Kunapareddy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/249,132

(22) Filed: Aug. 26, 2016

Related U.S. Application Data

(60) Provisional application No. 62/328,906, filed on Apr. 28, 2016.

(51) Int. Cl.
*G11C 11/406* (2006.01)
*G11C 11/408* (2006.01)

(52) U.S. Cl.
CPC .... *G11C 11/40615* (2013.01); *G11C 11/4085* (2013.01); *G11C 11/40622* (2013.01)

(58) Field of Classification Search
CPC .............. G11C 11/40615; G11C 11/40622
USPC ........................................... 365/222
See application file for complete search history.

(56) References Cited

U.S. PATENT DOCUMENTS

| | | | |
|---|---|---|---|
| 6,711,093 B1 * | 3/2004 | Shore | G11C 7/12 365/189.11 |
| 7,088,632 B2 | 8/2006 | Pelley | |
| 7,317,648 B2 * | 1/2008 | Jo | G11C 11/406 365/222 |
| 7,433,261 B2 * | 10/2008 | Freebern | G11C 8/12 365/189.04 |
| 7,492,656 B2 * | 2/2009 | Kim | G11C 11/406 365/189.05 |
| 7,916,569 B2 * | 3/2011 | Kim | G11C 11/406 365/189.05 |
| 8,982,654 B2 | 3/2015 | Dong et al. | |
| 9,001,608 B1 | 4/2015 | Chishti et al. | |
| 9,502,096 B2 * | 11/2016 | Rasband | G11C 7/02 |
| 2005/0041506 A1 | 2/2005 | Hwang et al. | |
| 2006/0104141 A1 * | 5/2006 | Jo | G11C 11/406 365/222 |
| 2006/0274591 A1 | 12/2006 | Fujioka et al. | |

(Continued)

OTHER PUBLICATIONS

Chang K.K.W., et al., "Improving DRAM Performance by Parallelizing Refreshes with Accesses," 2014, 12 pages.

(Continued)

*Primary Examiner* — Son Mai
(74) *Attorney, Agent, or Firm* — Muncy, Geissler, Olds & Lowe, P.C.

(57) ABSTRACT

Systems and method are directed to accessing a Dynamic Random Access Memory (DRAM) system. A DRAM controller is designed to determine that a DRAM bank of a DRAM system is in a self-refresh state and allow one or more commands to access the DRAM bank without exiting the self-refresh state. The DRAM controller may select these one or more commands, based on one or more of a clock frequency, traffic conditions related to requests for accessing the DRAM bank, or a command type. The one or more commands may include at least one of read (RD), write (WR), or precharge (PRE) commands received while the DRAM bank is in the self-refresh state.

25 Claims, 8 Drawing Sheets

(56) References Cited

U.S. PATENT DOCUMENTS

| | | | |
|---|---|---|---|
| 2007/0086258 A1* | 4/2007 | Freebern | G11C 8/12 |
| | | | 365/222 |
| 2011/0170367 A1* | 7/2011 | Kim | G11C 11/406 |
| | | | 365/222 |
| 2012/0151299 A1* | 6/2012 | Suh | G11C 11/40615 |
| | | | 714/764 |
| 2013/0304981 A1 | 11/2013 | Paz | |
| 2014/0241094 A1 | 8/2014 | Bains | |
| 2015/0026399 A1 | 1/2015 | Coquelin et al. | |
| 2015/0085595 A1 | 3/2015 | Ware et al. | |

OTHER PUBLICATIONS

International Search Report and Written Opinion—PCT/US2017/018650—ISA/EPO—dated May 26, 2017.

\* cited by examiner

US 9,824,742 B1

DRAM ACCESS IN SELF-REFRESH STATE

CROSS-REFERENCE TO RELATED APPLICATION

The present Application for Patent claims the benefit of Provisional Patent Application No. 62/328,906 entitled "DRAM ACCESS IN SELF-REFRESH STATE" filed Apr. 28, 2016, and assigned to the assignee hereof and hereby expressly incorporated herein by reference in its entirety.

FIELD OF DISCLOSURE

Disclosed aspects are directed to Dynamic Random Access Memory (DRAM). More particularly, exemplary aspects are directed to DRAM access in a self-refresh state.

BACKGROUND

DRAM systems provide low-cost data storage solutions because of the simplicity of their construction. Essentially, DRAM cells are made up of a switch or transistor, coupled to a capacitor. FIG. 1 illustrates a conventional DRAM cell 100 comprising transistor 106 and capacitor 108. Transistor 106 is turned on when word line 102 is activated, and the voltage (high/low) on bit line 104 is transferred to capacitor 108, causing capacitor 108 to store corresponding information (logic "1"/logic "0", respectively). DRAM systems are organized as DRAM arrays comprising DRAM cells such as DRAM cell 100 organized in rows and columns. As can be appreciated, given the simplicity of DRAM cells, the construction of DRAM systems incurs low cost and high density integration of DRAM arrays is possible. However, because capacitors are leaky, the charge stored in capacitor 108 needs to be periodically refreshed in order to correctly retain the information stored therein.

Conventional refresh operations involve reading out each DRAM cell (e.g., row by row) in a DRAM array and immediately writing back the data read out to the corresponding DRAM cells without modification, with the intent of preserving the information stored therein. Accordingly, the refresh operations consume power. Depending on specific implementations of DRAM systems (e.g., double data rate (DDR), low power DDR (LPDDR), etc., as known in the art) a minimum refresh frequency is defined, wherein if a DRAM cell is not refreshed at a frequency that is at least the minimum refresh frequency, then the likelihood of information stored therein becoming corrupted increases. If the DRAM cells are accessed for memory access operations such as read or write operations, the accessed DRAM cells are refreshed as part of performing the memory access operations. To ensure that the DRAM cells are being refreshed at least at a rate which satisfies the minimum refresh frequency even when the DRAM cells are not being accessed for memory access operations, various dedicated refresh mechanisms may be provided for DRAM systems.

One refresh mechanism known in the art is referred to as an auto-refresh. A DRAM controller (e.g., a DDR controller, as known in the art for DDR systems) manages refresh operations in an auto-refresh state. The DRAM controller may direct a refresh command to be issued to the DRAM system at a specified refresh rate in the auto-refresh state.

Another refresh mechanism known in the art is referred to as a self-refresh, which may be internally managed by the DRAM system. A self-refresh state may be entered in a low power state of the DRAM system, such as an idle or standby state. In the self-refresh state, each row of a DRAM array may be taken through a sequence of read out and write back, over the course of a refresh cycle.

If memory access commands for performing memory access operations on the DRAM cells are received by a DRAM system while the DRAM system is in the low power state, the DRAM system may be taken out of the low power state into an active mode in order to service the memory access operations. This may entail exiting the self-refresh and entering the auto-refresh state. In conventional systems, transitioning from the self-refresh state to an auto-refresh state may also entail executing an additional refresh command to perform an additional refresh operation before exiting the self-refresh state, with an objective of ensuring that the minimum refresh frequency has been met before the transition takes place. As can be appreciated, power consumption by the DRAM system increases when the DRAM system is taken out of the low power state to an active state; and the additional refresh command adds to the increased power consumption.

Some DRAM applications may involve accesses to the DRAM cells for short durations of time while the DRAM system is in a low power state such as idle or standby. For example, in some wireless communication systems, a mobile phone may be required to periodically ping a base station or a cell phone tower even when the mobile phone is in a standby mode. Each ping may involve accessing a DRAM system in the mobile phone for a short duration of time. Conventional methods of accessing the DRAM system for each ping may entail exiting the low power state of the DRAM system and entering an active state. Thus, each ping can consume significant power.

There is an ever-increasing need for reducing power consumption of computing devices, particularly battery-operated handheld devices such as mobile phones, tablets, laptops, etc. Thus, there is also a corresponding need in the art for reducing the power consumption of DRAM systems.

SUMMARY

Exemplary aspects of the invention are directed to a Dynamic Random Access Memory (DRAM) system, wherein, a DRAM controller is designed to determine that a DRAM bank of the DRAM system is in a self-refresh state and allow one or more commands to access the DRAM bank without exiting the self-refresh state. The DRAM controller may select these one or more commands, based on one or more of a clock frequency, traffic conditions related to requests for accessing the DRAM bank, or a command type. The one or more commands may include at least one of read (RD), write (WR), or precharge (PRE) commands received while the DRAM bank is in the self-refresh state.

Accordingly, an exemplary aspect is directed to a method of operating a dynamic random access memory (DRAM), the method comprising, determining that the DRAM is in a self-refresh state, and allowing one or more selected commands to access the DRAM without exiting the self-refresh state.

Another exemplary aspect is directed to dynamic random access memory (DRAM) system comprising a DRAM controller configured to determine that a DRAM bank of the DRAM system is in a self-refresh state, wherein the DRAM controller is configured to allow one or more selected commands to access the DRAM bank without exiting the self-refresh state Yet another exemplary aspect is directed to an apparatus comprising means for determining that a dynamic random access memory (DRAM) bank is in a self-refresh state, and means for allowing one or more selected commands to access the DRAM bank without exiting the self-refresh state.

Another exemplary aspect is directed to a non-transitory computer-readable storage medium comprising code, which, when executed by a processor, causes the processor to perform operations for operating a dynamic random access memory (DRAM), the non-transitory computer-readable storage medium comprising: code for determining that the DRAM is in a self-refresh state, and code for allowing one or more selected commands to access the DRAM without exiting the self-refresh state.

BRIEF DESCRIPTION OF THE DRAWINGS

The accompanying drawings are presented to aid in the description of aspects of the invention and are provided solely for illustration of the aspects and not limitation thereof

DETAILED DESCRIPTION

Figure 1:
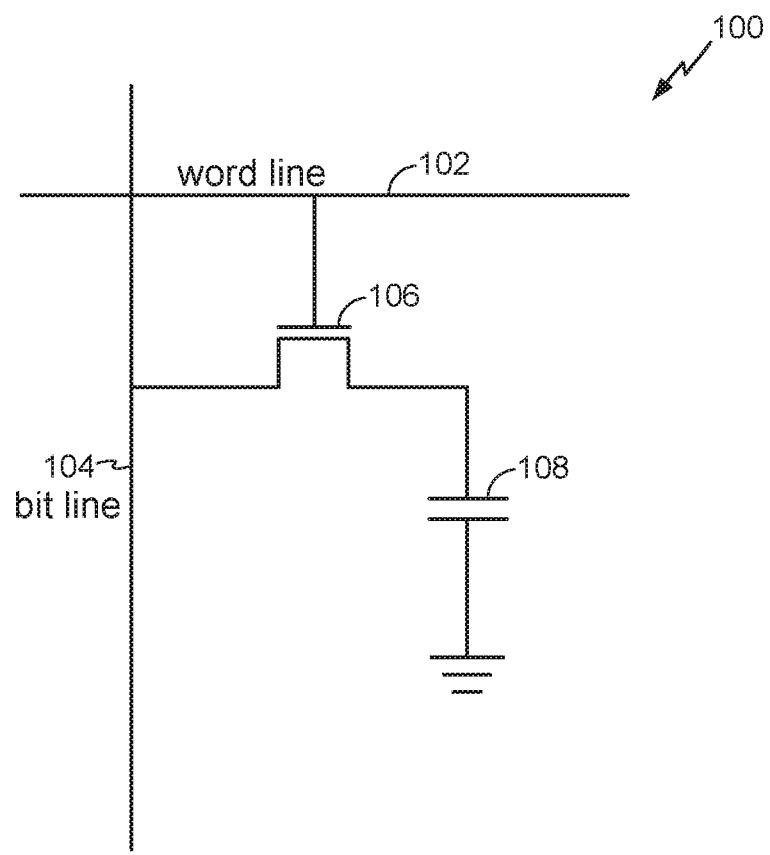
FIG. 1 illustrates a conventional DRAM cell.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Exemplary aspects of this disclosure are directed to reducing power consumption in DRAM systems. In some aspects, power consumption by a DRAM system is reduced by allowing selected commands to access DRAM cells of an exemplary DRAM system during self-refresh state, without exiting the self-refresh state. For example, DRAM access protocols can be modified to allow one or more DRAM banks (or DRAM pages) comprising DRAM cells to be opened for short durations of time, without exiting the self-refresh state. The duration of time for which the DRAM banks can be opened without exiting the self-refresh state may be a function of the minimum refresh frequency specified for the DRAM system. One or more commands for activating a DRAM bank may be selected, or determined as one or more "selected commands" (as described herein) which can be allowed access to the DRAM bank without exiting the self-refresh state, based on estimated durations of time for which the one or more commands need to activate the DRAM bank, relative to a function of a refresh interval of the DRAM bank. For example, if the predicted duration of access of a command is small enough to ensure that opening the DRAM banks for servicing the command would not violate the integrity of data stored in the DRAM banks (e.g., satisfy specified minimum refresh frequency requirements), the command may be a selected command which can be allowed access to the DRAM banks during a self-refresh state, without exiting the self-refresh state. Example DRAM systems and related methods according to disclosure will now be explained in greater detail with reference to the figures below.

Figure 2A:
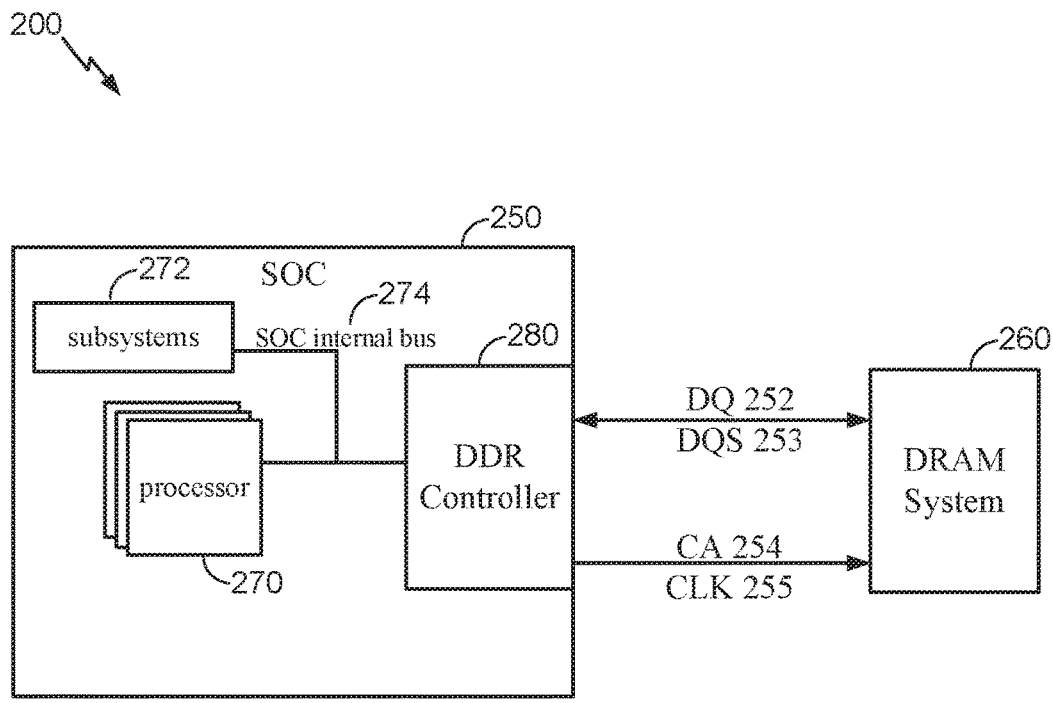
FIG. 2A illustrates a processing system configured according to exemplary aspects of this disclosure.

With reference first to FIG. 2A, a simplified schematic diagram is illustrated for processing system 200, configured according to exemplary aspects of this disclosure. Keeping in mind that various other components and alternative arrangements may be present in different implementations, in the example shown, processing system 200 includes system on chip (SOC) 250 and DRAM system 260. SOC 250 may comprise various components, among which one or more processing cores (e.g., central processing units or "CPUs") are representatively shown as processor 270 and various other subsystems which may be present (e.g., a graphics processing unit, a digital signal processor (DSP), etc.) are representatively shown as subsystems 272. Processor 270 and subsystems 272 may access DRAM system 260 by making requests to DRAM controller 280 via interconnections and networks representatively shown as SOC internal bus 274 (keeping in mind that one or more levels of caches, not explicitly shown, may also be present and accessed prior to memory requests reaching DRAM controller 280). DRAM controller 280 may be configured to manage accesses to DRAM system 260, wherein the accesses can include sending commands and addresses on a combined command-address bus shown as CA 254 clocked by CLK 255; and data can be sent to and/or received from DRAM system 260 on a bidirectional data bus DQ 252, clocked by DQS 253. The notations "CA," "DQ," "DQS," etc., in this disclosure are chosen to reflect standard notations known in the art for these aspects, but it will be understood that exemplary aspects are not limited to any specific technology based on these notations, and as such, aspects of this disclosure may be equally applicable to any memory system such as DRAM system 260. In exemplary aspects, DRAM controller 280 can determine (e.g., using various combinations of hardware and/or software techniques which will be discussed in later sections) whether access of DRAM system 260 for selected commands can be allowed in self-refresh state.

Figure 2B:
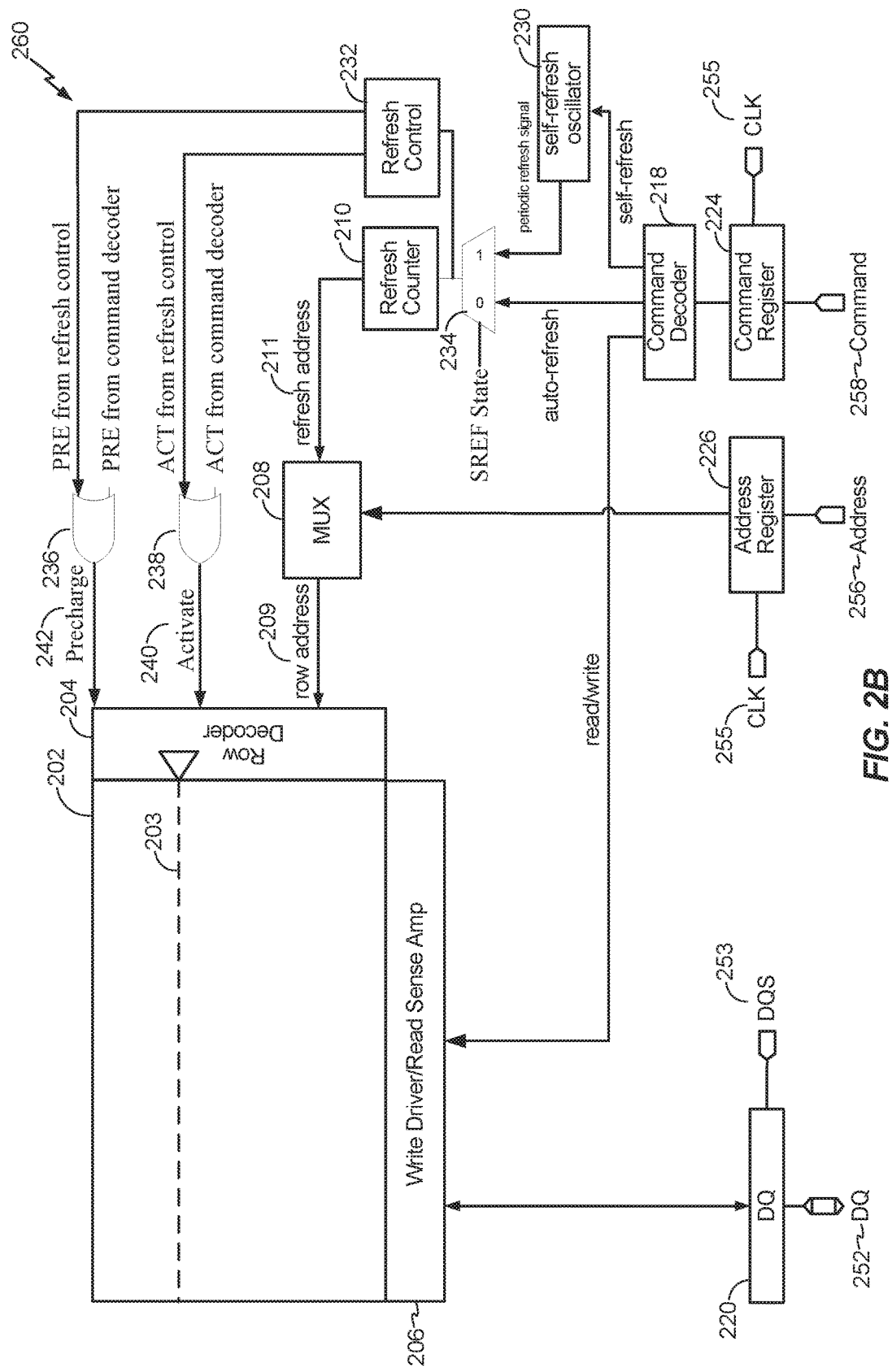
FIG. 2B illustrates a DRAM system configured according to exemplary aspects of this disclosure.

With reference to FIG. 2B, a detailed view of DRAM system 260 of FIG. 2A, configured according to exemplary aspects is illustrated. DRAM system 260 may be designed to meet specifications such as JESD209-4 for LPDDR4, JESD79-4 for DDR4, etc. DRAM system 260 comprises one or more DRAM banks, of which DRAM bank 202 is particularly illustrated. DRAM bank 202 may comprise an array of DRAM cells (which may be similar to conventional DRAM cell 100). It is noted that although DRAM bank 202 is referred to as a DRAM bank in example aspects, this may alternatively represent a sub-bank in some cases, without loss of generality.

The commands and addresses received from command-address bus CA 254 in FIG. 2A are separately shown as inputs: command 258 and address 256, clocked by CLK 255. Input/output DQ 252 clocked by data strobe DQS 253 collectively represents the data input to DRAM system 260 (e.g., from DRAM controller 280 for a write or store of data from processor 270/subsystems 272) and the data output (e.g., to DRAM controller 280 for a read or load of data requested by processor 270/subsystems 272).

In more detail, command 258 may specify a type of operation to be performed. Command 258 may be temporarily stored in command register 224 before being provided to command decoder 218. Command 258 may include various types of commands, including read/write commands and refresh commands. Command decoder 218 may decode command 258, for example, as a memory access operation (e.g., read/write) or a refresh operation such as auto-refresh or self-refresh. If command 258 specifies a memory access operation, a corresponding read or write indication is provided to the block shown as write driver/read sense amplifier 206, which will be explained in more detail below. Commands for memory access operations may be accompanied by an activate/precharge sequence.

In the case of read/write operations (which will be explained in further detail in the following sections), DRAM controller 280 may supply an activate command to activate a row (e.g., row 203 of DRAM bank 202) on which one or more read/write operations are to be performed, e.g., at column addresses supplied by address 256, and once the operations are completed on the activated row, a subsequent precharge command is supplied to deactivate the row and cause data stored in the DRAM cells of the row to be retained.

In the case of refresh operations, auto-refresh operations of DRAM system 260 may be externally managed, e.g., controlled by DRAM controller 280, while self-refresh operations may be internally managed within DRAM system 260. Command 258 may specify whether a refresh operation is an auto-refresh or a self-refresh. For both auto-refresh and self-refresh, refresh counter 210 may be used for supplying refresh address 211 (from which row address 209 of the row to be refreshed can be determined); and refresh control 232 may be used for providing activate and precharge signals in the accompanying activate/precharge sequence for refreshing each row. For the externally managed auto-refresh, refresh counter 210 is triggered (e.g., caused to be incremented) for each auto-refresh command. On the other hand, for the internally managed self-refresh, a single self-refresh command (e.g., sent by DRAM controller 280) can place DRAM system 260 in a self-refresh state, wherein self-refresh oscillator 230 may be used for incrementing refresh counter 210 and correspondingly stepping through refresh operations for each row of DRAM bank 202, until the self-refresh state is exited (e.g., based on a subsequent command 258 received from DRAM controller 280). Thus, multiplexor (mux) 234 may select between auto-refresh or the periodic refresh signal generated from self-refresh oscillator 230 for triggering refresh counter 210 based on whether command 258 indicates an auto-refresh or a self-refresh, respectively.

When triggered by either an auto-refresh command or by the periodic refresh signals in self-refresh state, refresh counter 210 may be configured to cyclically increment (or decrement, without loss of generality) a count value to generate refresh address 211, which indicates a row address at which a refresh operation is to be performed. Over the course of a refresh cycle, all rows of DRAM bank 202 are configured to be refreshed. Refresh counter 210 (managed by auto-refresh or the periodic refresh signal for self-refresh) is configured to operate at a frequency which would ensure that each row of DRAM bank 202 is refreshed at least at a frequency which is a specified minimum refresh frequency. Refresh address 211 is provided to multiplexor (mux) 208.

As previously mentioned, refresh control 232 provides activate and precharge signals for refresh operations. Activate and precharge signals may also be received from command decoder 218, e.g., decoded from command 258, accompanying read/write operations. The signal, activate 240 may be generated using an OR gate 238 which implements an OR function of the activate signals from refresh control 232 and command 258; and the signal, precharge 242 may be generated using an OR gate 236 which implements an OR function of the precharge signals from refresh control 232 and command 258. As previously discussed, activate 240 is configured to activate a row (e.g., enable a word line corresponding to row 203) to be refreshed and once the activate operation is complete, precharge 242 is asserted, to deactivate the row, or close a corresponding DRAM bank, e.g., DRAM bank 202, after sufficient time has lapsed after the activate state, to ensure that data has been written back into the DRAM cells which were refreshed.

Figure 5:
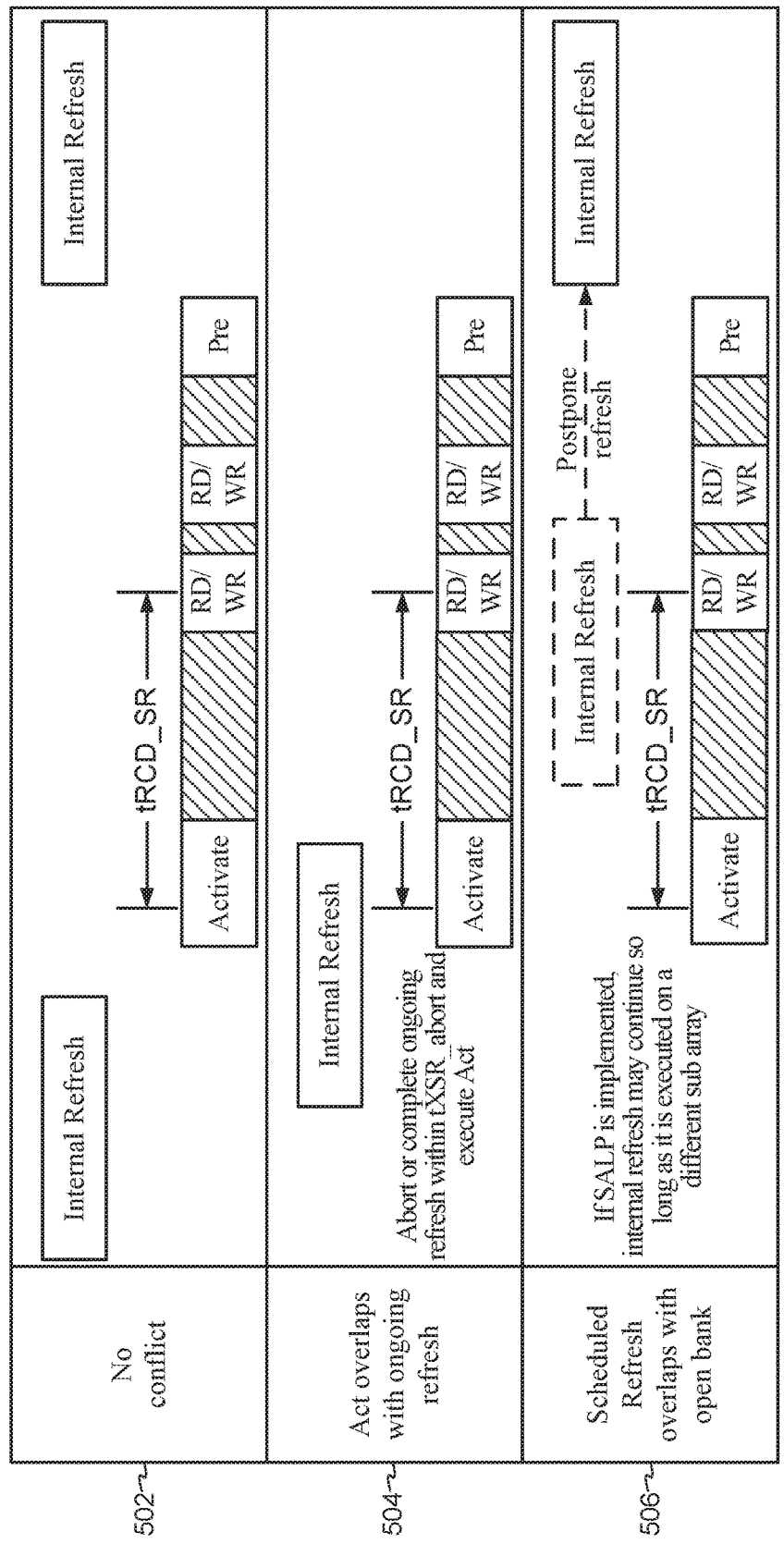
FIG. 5 illustrates timing diagrams showing a relationship between refresh operations and execution of selected commands in a self-refresh state of a DRAM system.

As can be appreciated, it is possible for a command 258 to be received from command decoder 218 which would require an activate/precharge sequence while an internally managed self-refresh is in progress, thus resulting in an overlap or conflict. FIG. 5 illustrates some example scenarios where such a conflict may be possible and potential solutions for managing such conflicts, which will be discussed in further detail in later sections of this disclosure.

With continued reference to FIG. 2B, revisiting read/write operations, address 256 may specify the address of a row of DRAM bank 202 at which a memory access operation (e.g., read/write specified by command 258) is to be performed. Address 256 may be temporarily stored in address register 226 before being supplied to mux 208 as well. Mux 208 may select between refresh address or address 256 received from address register 226 to generate row address 209. Controls for mux 208 based on which mux 208 may carry out this selection will be described in the following sections in more detail. Row decoder 204 is configured to enable a specific row (e.g., highlighted row 203 in the illustration) based on row address 209.

The data input received on DQ 252 may be temporarily stored in register DQ 220 before being written into DRAM bank 202. In an example where command 258 indicates a write operation to be performed at an address provided by address 256, a write driver portion of write driver/read sense amplifier 206 may drive the data input on to bit lines. Mux 208 selects row address 209 to correspond to address 256, which enables a word line at row 203. The data input is transferred from the bit lines to DRAM cells coupled to the word line at row 203.

In another example where command 258 indicates a read operation to be performed at an address provided by address 256, a read sense amplifier portion of write driver/read sense amplifier 206 is used. Mux 208 selects row address 209 to correspond to address 256, which enables a word line at row 203. The data stored in DRAM cells coupled to the word line at 203 is transferred on to the corresponding bit lines and amplified by the read sense amplifier is temporarily stored in register DQ 220 and from there, provided as data output on DQ 252.

Figure 3:
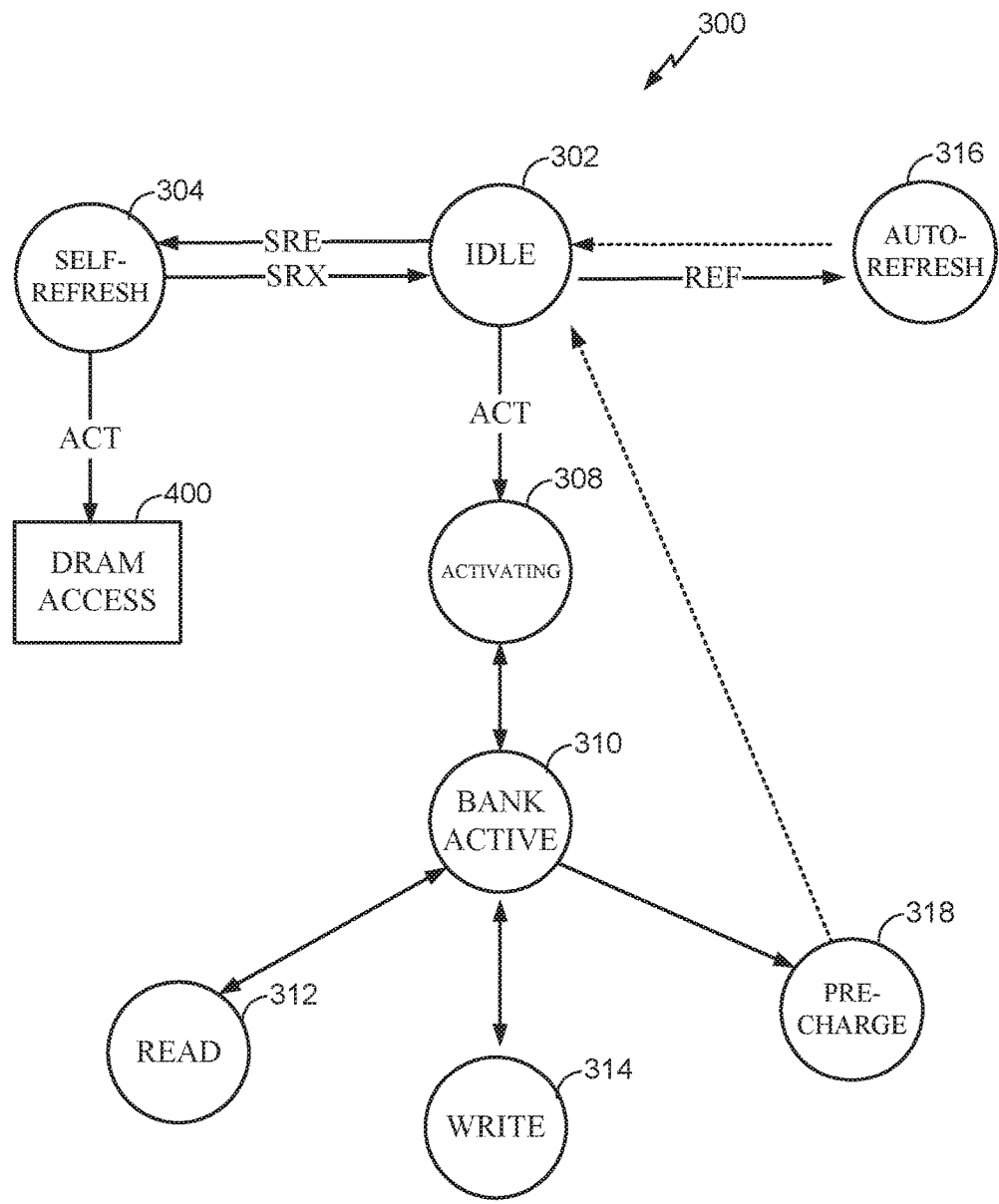
FIGS. 3-4 illustrate state transition diagrams for a DRAM system configured according to exemplary aspects of this disclosure.
Figure 4:
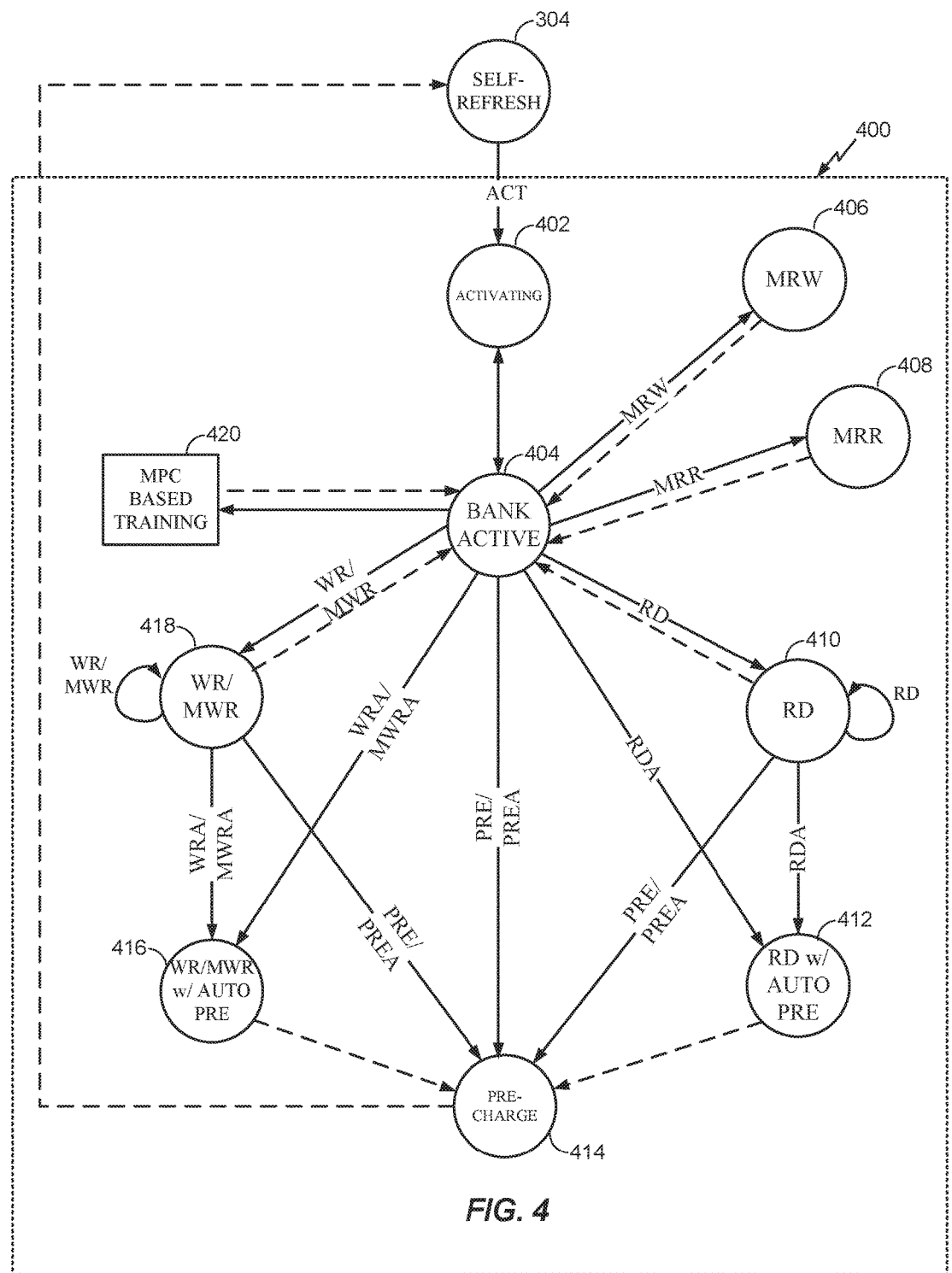

FIGS. 3-4 illustrate flow diagrams for state transitions of DRAM system 260. More specifically, FIG. 3 illustrates a general background for various states and state transitions that are possible for DRAM system 260, while FIG. 4 focuses more specifically on exemplary aspects of allowing selected commands to access DRAM banks (e.g., DRAM bank 202) while in a self-refresh state.

Referring now to FIG. 3, flow diagram 300 shows a few example states that DRAM system 260 can transition between, which may be a subset of states defined in standards such as LPDDR4 (see, e.g., JESD209-4 Low Power Double Data Rate 4 (LPDDR4); Published August 2014 by JEDEC Solid State Technology Association, page 10 for an exhaustive LPDDR4 state diagram). In FIGS. 3-4, a transition represented with an arrow shown in a solid line indicates a command sequence which causes the transition. An arrow shown in dashed lines indicates an automatic transition which takes place, i.e., without an explicit command.

With combined reference to FIGS. 2A-B, 3 and 4, starting from idle state 302, DRAM system 260 may receive commands from DRAM controller 280. For traditional commands which are accompanied by an activate/precharge sequence, an activate command would be received on command 258 prior to a read/write operation, for example. The activate command will cause a state transition to activating state 308 which causes a corresponding row determined by address 256 to be activated and placing DRAM system 260 in bank active state 310. One or more read/write commands, for example directed to the activated row, may be received following the activate command, which causes state transitions to corresponding read state 312 or write state 314 based on whether command 258 indicates read or write, respectively. Subsequent to the read/write commands following the activate command, DRAM controller 280 may issue a precharge command which causes state transition to precharge state 318, wherein the activated row is deactivated and corresponding open banks are closed. From precharge state 318, the state automatically transitions to idle state 302.

Once again, starting from idle state 302, if command 258 indicates an auto-refresh, the state can transition to auto-refresh state 316, wherein the above-described auto-refresh operations can be implemented, and once an auto-refresh is completed, the state automatically transitions back to idle 302.

Also starting from idle state 302, if command 258 indicates self-refresh (SRE), then self-refresh state 304 is entered and DRAM system 260 remains in self-refresh state 304, wherein the above-described self-refresh operations can be performed, until command 258 indicating self-refresh exit (SRX) causes self-refresh state 304 to be exited and transition back to idle state 302. While for standard commands, access to DRAM banks such as DRAM bank 202 may not be allowed while in self-refresh state 304, for a subset of commands which are selected based on their predicted duration of access (referred to herein as "selected commands"), access to the DRAM banks may be allowed. Thus, for the selected commands, flow diagram 400 for DRAM access as shown in FIG. 4 can be entered from self-refresh state 304. In this disclosure, DRAM access 400 may be performed when in self-refresh state 304, without exiting self-refresh state 304 (i.e., without transitioning back to idle state 302).

Referring now to FIG. 4, an expanded view of DRAM access 400 is provided, starting with self-refresh state 304. The following states encompassed within the state diagram for DRAM access 400 are said to be performed while DRAM system 260 is within the self-refresh state 304. Put another way, DRAM system 260 is said to remain in self-refresh state 304 until, for example, a self-refresh exit (SRX) command causes DRAM system 260 to exit to idle 302 of FIG. 3.

Like in the case of the previously discussed traditional commands, in the case of the selected commands received while DRAM system 260 is in self-refresh state 304, DRAM controller 280 may first supply an activating command on command 258, causing activating state 402 to be entered from self-refresh state 304. A row corresponding to an accompanying address on address 256 may be activated, placing DRAM system 260 in bank active state 404. Subsequent to the activate command, various commands such as read, write, precharge, etc., can be received on command 258 and serviced while DRAM system 260 is in bank active state 404, without exiting self-refresh state 304. From this perspective, the selected commands which are referred to as being serviced while in self-refresh state 304 may specifically include types of commands which require activation of one or more DRAM banks, also referred to as "bank active commands" in this disclosure. Example bank active commands and their corresponding state transitions will now be discussed. It is observed that for several such bank active commands, an automatic transition to precharge state 414 is possible (e.g., if the bank active command is of a type which automatically requires precharge once servicing of the command is complete). In some cases, an explicit precharge command may also be issued following some bank active commands (e.g., if the bank active commands do not automatically cause transition to precharge state 404), which also causes state transition to precharge state 414 from bank active state 404. From precharge state 414, the activated row or open bank may be closed and state can automatically transition back to self-refresh 304.

Referring to FIG. 4, starting from bank active state 404, a mode register write (MRW) command causes a transition to MRW state 406 to execute the MRW command (e.g., by accessing DRAM bank 202), and once completed, the state automatically transitions back to bank active state 404. A mode register read (MRR) command causes a transition to MRR state 408 to execute the MRR command (e.g., by accessing DRAM bank 202), and once completed, the state automatically transitions back to bank active state 404. A read (RD) command causes a transition to RD state 410, to execute the RD command (e.g., by accessing DRAM bank 202), where the state can remain at RD state 410 if more RD commands are received in RD state 410; and once all RD commands have been executed, the state can automatically transition back to bank active state 404.

If a read with auto precharge (RDA) is received while in RD state 410, the state can transition to RD with auto precharge state 412. RD with auto precharge state 412 can also be entered from bank active state 404 if a RDA command is received. In RD with auto precharge state 412, a read operation can be performed automatically followed by a precharge operation, without requiring an explicit precharge command to be received, as one example discussed above for automatically entering precharge state 414. Precharge state 414 can also be entered from bank active state 404 or RD state 410 if a precharge (PRE) or precharge all (PREA) command is received; from write (WR)/mask-write (MWR) state 418 if a write with auto precharge (WRA) or MWR with auto precharge (MWRA) command is received; or automatically from WR/MWR with auto precharge state 416. From precharge state 412, the state can automatically transition back to self-refresh 304, as previously mentioned.

From bank active state 404, the state can transition to MR/MWR state 418 if a WR/MWR command is received, stay in MR/MWR state 418 if additional WR/MWR commands are received, and then transition back automatically to bank active 404; to precharge state 414 if a PRE/PREA command is received, as mentioned above; or to WR/MWR with auto precharge state 416 if a WRA/MWRA command is received. From bank active state 404, the state can also transition to MR/MWR with auto precharge state 416 if a WRA/MWRA command is received.

From bank active state 404, it is also possible to transition to multipurpose command (MPC) based training 420 and transition back automatically once MPC based training is complete. Although not illustrated or described, it is possible for various other bank active commands to similarly be executed from bank active state 404, without exiting self-refresh state 304, and these bank active commands may be selected or determined, for example, based on their predicted duration of access of one or more banks of DRAM system 260.

With reference now to FIG. 5, previously mentioned aspects related to determining conflicts between external commands (e.g., received from DRAM controller 280) and internal refresh operations (e.g., while in the self-refresh state 304), and techniques for avoiding/handling such conflicts will be described.

Timelines 502, 504, and 506 represent possible timing relationships between external commands (e.g., selected bank active commands which can be allowed bank access while DRAM system 260 is in the self-refresh state) and the internal refresh operations. In this regard, the following notations are used in accordance with standard terminology used in DRAM specifications, once again, keeping in mind that use of this terminology is not intended as a limitation of exemplary aspects to any specific technology, but merely for the sake of ease of explanation. A time duration referred to as "tRCD" represents the number of wait cycles (e.g., of CLK 255) required, starting from when an activate command is issued (e.g., on command 258) for a row address (e.g., on address 256) to DRAM system 260, to when the addressed row, e.g., row 203 is activated. Thus, in a self-refresh state, tRCD is referred to as "tRCD_SR" in this disclosure. In example aspects, tRCD_SR may be defined in a corresponding specification (e.g., for LPDDR4) as a time that DRAM controller 280, for example, may need to wait in the self-refresh state after providing a selected bank activate command to activate DRAM bank 202, for example, when DRAM bank 202 is in the self-refresh state, before a subsequent read/write command may be issued. A time duration referred to as "tXSR" represents a number of clock cycles needed for exiting the self-refresh state, and the time duration "tXSR_abort" refers to a number of clock cycles needed for aborting an ongoing operation and exiting the self-refresh state. In timelines 502, 504, and 506, the time duration involved for execution of an external command sequence comprising: an activate command (Active) followed by one or more subsequent bank active commands (e.g., Read/Write, "RD/WR") after tRCD_SR wait cycles followed by precharge command (Pre), is shown juxtaposed with internal refresh operations.

Referring to timeline 502, the external command sequence can be executed between two consecutive internal refresh operations, e.g., for row 203 while DRAM bank 202 is in self-refresh state 304. In this case, the minimum refresh frequency is seen to have a corresponding refresh interval (referred to as "tREFI", the time between two consecutive refresh operations) which can accommodate the external command sequence without any overlaps or conflicts between the two internal refresh operations. In such a case, ensuring that the time that the DRAM bank is active (i.e., the time taken from the activate command (Active) to the precharge command (Pre) is smaller than tREFI would be sufficient to support exemplary aspects of allowing the selected bank active commands (which follow the activate command) to activate the banks in the self-refresh state.

Timeline 504 illustrates a case where the external command sequence has a time overlap with an ongoing internal refresh. In this case, to support the exemplary aspects of this disclosure, the ongoing internal refresh operation would need to be completed or aborted within tXSR_abort before the external command sequence can be executed.

Finally, timeline 506 illustrates another case where the external command sequence and an ongoing internal refresh overlap in time, but the internal refresh attempt is started after execution of the external command sequence has started. In some cases it is possible to redirect the internal refresh to a different bank (if such mechanisms are supported), but in general, to ensure that the specifications are met, the internal refresh may be postponed to allow execution of the external command sequence to complete before the internal refresh starts. The example illustrated as timeline 506 relates to an "SALP" technique for managing DRAM refresh operations as known in the art, which allows multiple rows to be enabled in the same DRAM bank with some overlap conditions.

Exemplary aspects may involve adjusting timing constraints for refresh operations, for allowing the one or more selected commands to access the DRAM without exiting the self-refresh state. For example, to ensure that allowing any selected commands to activate DRAM banks does not violate timing requirements in all three scenarios depicted as timelines 502, 504, and 506, timing constraints may be imposed or adjusted on bank active commands which may be executed while in the self-refresh state. It is seen that in some examples, setting tRCD_SR such that tRCD_SR is approximately tRCD+tSXR_abort or at least equal to tRCD+tSXR_abort would allow the exemplary features to be supported (e.g., per timeline 504, wherein, wherein tRCD is the wait time before a row of DRAM bank 202 is activated following a bank active command received at DRAM bank 202, tRCD_SR is the wait time before the row of DRAM bank 202 is activated based on the one or more selected commands while in the self-refresh state, and tSXR_abort is the time duration for aborting an ongoing DRAM access of DRAM bank 202 and exiting the self-refresh state). The duration of time for which a bank may remain in an activated state in the self-refresh state can also be constrained as a function of the refresh interval (e.g., the maximum duration of time DRAM system 260 can remain in bank active state 404 during self-refresh state 304 can be constrained to not exceed 8*tREFI in some cases).

Thus, in a non-limiting example, if periodic activities of a mobile phone for pinging a base station or tower have an estimated duration of time for which they need to activate a DRAM bank as being less than 1 microsecond (us), and corresponding specifications for a DRAM in the mobile phone require a refresh to be performed at a refresh interval tREFI of 3.9 us, exemplary aspects can allow the periodic activities for pinging to access the DRAM while the DRAM is in a self-refresh state, without exiting the self-refresh state. In general, commands which have an estimated or predicted duration of time for which they require access to a DRAM bank as small enough to not violate the above timing considerations, may be considered for being treated as selected bank active commands which can be issued by DRAM controller 280 while DRAM system 260 is in a self-refresh state, without first issuing a self-refresh exit (SRX) command, for example, to cause DRAM system 260 to exit the self-refresh state.

Accordingly it will be appreciated that power consumption can be reduced in exemplary aspects. For example, referring back to FIG. 3, in the case of conventional implementations if any bank active commands are received while a traditional DRAM system is in self-refresh state 304, the traditional DRAM system would be taken out of self-refresh state 304, transitioned to idle state 302, possibly taken to auto refresh state 316 (as a precautionary measure to ensure that minimum refresh periods are met and a crucial internal refresh was not interrupted or missed when self-refresh state 304 was exited), and then transitioned from idle state 302 to activating state 308 before bank active state 310 may be reached for servicing the bank active commands. As can be appreciated, the above sequence consumes significant delays and power, which may be avoided in exemplary aspects.

In contrast to the conventional implementations, in exemplary aspects, selected bank active commands received while exemplary DRAM system 260 is in self-refresh state 304, may be serviced according to DRAM access 400 of FIG. 4 without exiting self-refresh state 304, thus avoiding the corresponding traditional delays and power consumption.

In exemplary aspects, DRAM controller 280, for example, can include combinations of hardware, software, etc., for determining system conditions where the above-described exemplary features of allowing DRAM access while in the self-refresh state may be permitted. In this regard, DRAM controller 280 can be configured to measure the traffic related to access of DRAM bank 202, for example, and DRAM bank 202 in the self-refresh state if the traffic is light. For example, DRAM controller 280 can determine, e.g., based on frequency of a system clock and pending requests (e.g., in read/write queues implemented in DRAM controller 280), whether the traffic related to DRAM access is relatively light or heavy. In one aspect, a frequency lower than a predetermined value for a shared system clock such as CLK 255 can indicate that the clock has been adjusted for lower performance, based on lower demand of SOC 250 which accesses DRAM system 260, for example. Thus, when low traffic or activity is detected by DRAM controller 280 may place DRAM system 260 in the self-refresh state, e.g., by issuing a self-refresh command. While in the self-refresh state, DRAM controller 280 may implement exemplary features to allow selected bank active commands to access DRAM system 260 without issuing a self-refresh exit command, for example.

In some aspects, DRAM controller 280 may be further configured to cause DRAM bank 202 to exit the self-refresh state if a change in frequency of accessing DRAM system 260 or more specifically, DRAM bank 202, is indicated by an external command. While in the self-refresh state, if a new access request is received by DRAM controller 280 (e.g., from processor 270 for access to DRAM system 260) with a change in frequency, this change in frequency can be used by DRAM controller 280 as an indication for bringing DRAM system 260 out of the self-refresh state. Otherwise, if exiting the self-refresh state is not seen to be in order, DRAM controller 280 may retain DRAM system 260 in the self-refresh state. It is noted that in case DRAM controller 280 incorrectly determined that DRAM system 260 is to remain in self-refresh state, e.g., while servicing selected commands, DRAM controller 280 can cause DRAM system 260 to fully exit the self-refresh state, e.g., when an allotted or predicted time for completing the selected bank active command has expired.

In some aspects, DRAM controller 280 can implement programmable registers for determining whether traffic is light, in accordance with exemplary techniques. A threshold number can be programmed into the registers such that if DRAM controller 280 receives a number of requests (e.g., from processor 270 for access to DRAM system 260) within a window of time which is less than the threshold, then the traffic may be determined to be light, causing DRAM controller 280 to direct DRAM system 260 to remain in the self-refresh state to service selected bank active commands, as discussed previously.

In some aspects, it is also possible to configure DRAM controller 280 to cause DRAM system 260 to remain in the self-refresh state for a predetermined period of time (wherein the period of time can be programmable via a register, for example). DRAM controller 280 may allow selected bank active commands to access DRAM system 260 without exiting the self-refresh state, before the period of time expires.

In another aspect, a signal or a value/state set in a register can indicate to DRAM controller 280, that a request received for DRAM access (e.g., by processor 270) is related to the above-described pinging or for executing paging functions or algorithms, which can be examples of selected bank active commands which may be serviced without exiting the self-refresh state. DRAM controller 280 can implement exemplary techniques based on such signals or register values for servicing selected bank active commands without exiting the self-refresh state.

Figure 6:
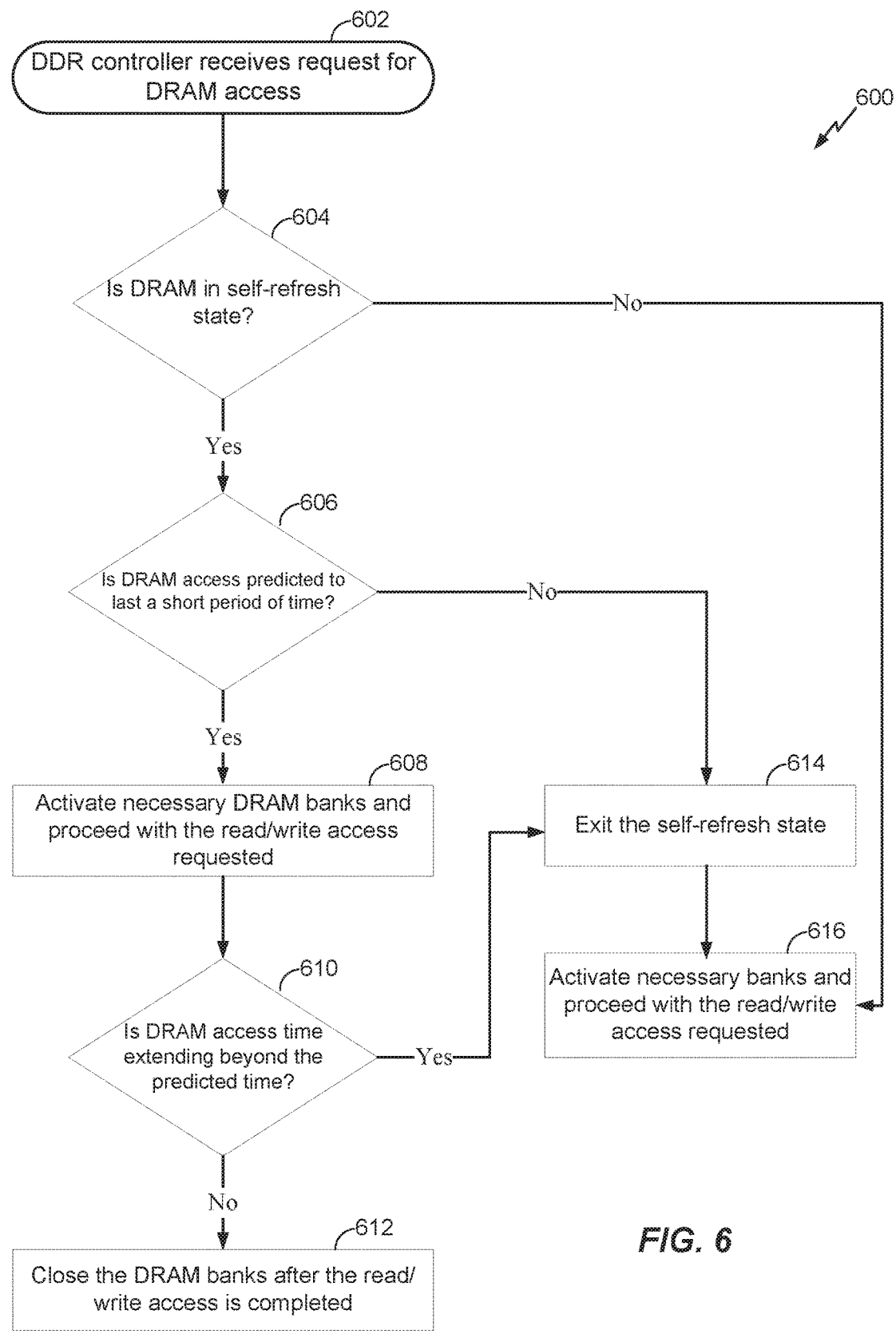
FIG. 6 illustrates a flow chart pertaining to a method of operating a DRAM system according to exemplary aspects of this disclosure.

It will be appreciated that aspects include various methods for performing the processes, functions and/or algorithms disclosed herein. For example, as illustrated in FIG. 6, an aspect can include a method 600 of operating a DRAM (e.g., DRAM system 260).

Block 602 of method 600 can comprise receiving a request at DRAM controller 280, for example, for a read/write access of DRAM system 260.

In decision Block 604, DRAM controller 280 may determine if DRAM system 260 is in self-refresh state 304, for example. If DRAM system 260 is not in self-refresh state 304, then the request may be serviced in a conventional manner, e.g., by entering Block 616, wherein bank active state 310 may be reached for activating one or more DRAM banks (e.g., DRAM bank 202) necessary for servicing the request. If DRAM system 260 is in self-refresh state 304, then from decision Block 604, method 600 transitions to decision Block 606.

In decision Block 606, DRAM controller 280 determines whether the requested access is expected to last a short period of time, e.g., based on a predicted duration (which may be obtained from processor 270 and/or based on the type of the access, e.g., pinging, paging, etc., as discussed above). The short period of time refers to a period of time which would not violate specifications such as minimum refresh periods for DRAM system 260. If the predicted duration exceeds the short period of time, then method 600 transitions to Block 614, wherein self-refresh state 304 is exited, e.g., by DRAM controller 280 sending a self-refresh exit (SRX) command to DRAM system 260.

If the expected time period for the requested access is determined to last short period of time in Block 606, then Block 608 is entered wherein DRAM access 400 of FIG. 4 may be followed and necessary DRAM banks may be activated to service the request for DRAM access, e.g., read/write access of DRAM bank 202, without transitioning to Block 614 for exiting the self-refresh state.

In decision Block 610, it is determined whether the processes in Block 608, i.e., DRAM access 400 of FIG. 4 is exceeding the expected/predicted time period, and if so, method 600 transitions to Block 614 to exit the self-refresh state and enter Block 616, where, as previously, the DRAM banks are activated in a conventional manner, e.g., as in bank active state 310.

However, if in decision Block 610, it is determined that the processes in Block 608, i.e., DRAM access 400 of FIG. 4 are not exceeding the expected/predicted time period, then Block 612 is reached where the processes are allowed to complete and any opened DRAM banks are closed (again, without exiting to Block 614 for exiting the self-refresh state).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer readable media embodying a method for accessing a DRAM array and performing low power self-correction by integrating a self-correction operation within a self-refresh cycle. Accordingly, the invention is not limited to illustrated examples and any means for performing the functionality described herein are included in aspects of the invention.

Figure 7:
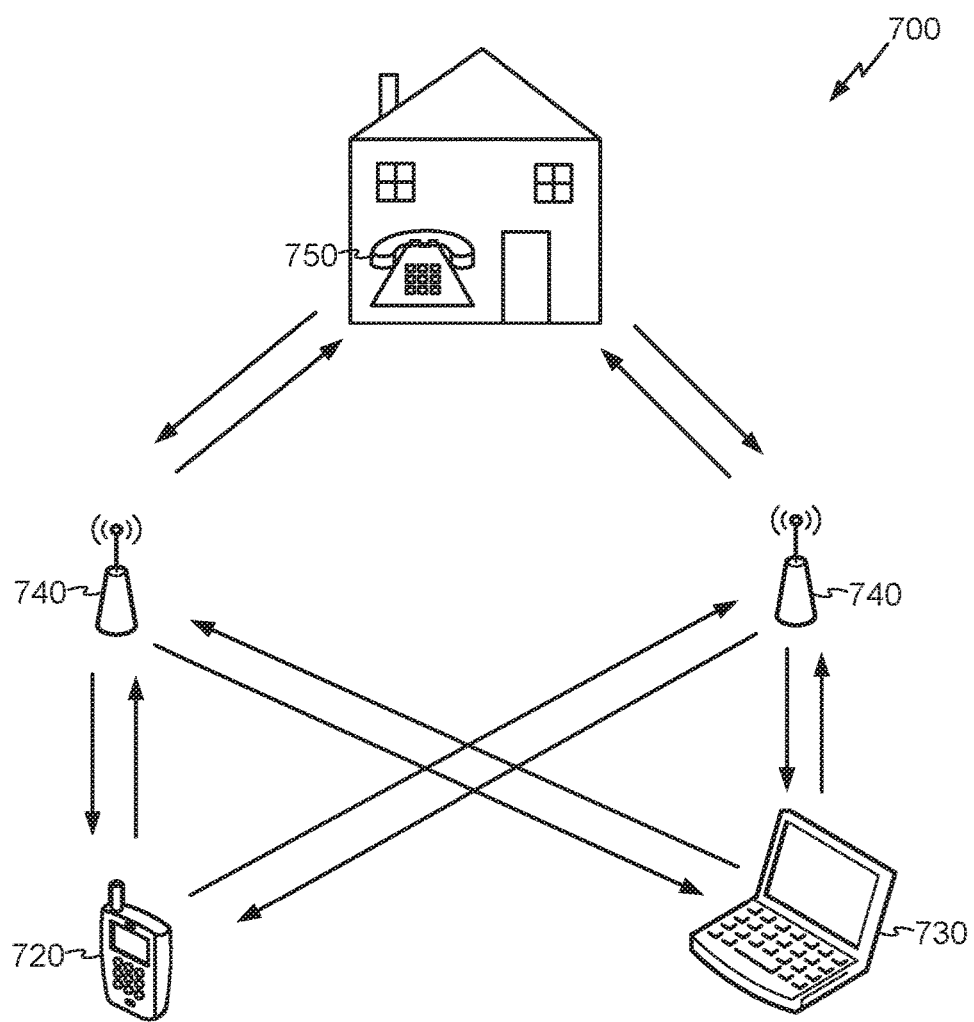
FIG. 7 is a block diagram showing an exemplary wireless communication system in which aspects of the disclosure may be advantageously employed.

FIG. 7 illustrates an exemplary wireless communication system 700 in which an aspect of the disclosure may be advantageously employed. For purposes of illustration, FIG. 7 shows three remote units 720, 730, and 750 and two base stations 740. In FIG. 7, remote unit 720 is shown as a mobile telephone, remote unit 730 is shown as a portable computer, and remote unit 750 is shown as a fixed location remote unit in a wireless local loop system. An example remote unit such as remote units 720, 730, and 750 may be a a set top box, a music player, a video player, an entertainment unit, a navigation device, a personal digital assistant (PDA), a fixed location data unit, a computer, a laptop, a tablet, a communications device, a mobile phone, or any other device that stores or retrieves data or computer instructions, or any combination thereof. Although FIG. 7 illustrates remote units according to the teachings of the disclosure, the disclosure is not limited to these exemplary illustrated units. Aspects of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method of operating a dynamic random access memory (DRAM) system, the method comprising:
    determining that a DRAM bank of the DRAM system is in a self-refresh state; and
    allowing one or more selected commands to access the DRAM bank without exiting the self-refresh state; and
    adjusting timing constraints for refresh operations for allowing the one or more selected commands to access the DRAM bank without exiting the self-refresh state, comprising setting tRCD_SR as equal to least equal to tRCD+tSXR_abort, wherein tRCD is a wait time before a row of the DRAM bank is activated following a bank active command received at the DRAM bank, tRCD_SR is a wait time before the row of the DRAM bank is activated based on the one or more selected commands while in the self-refresh state, and tSXR_abort is a time duration for aborting an ongoing DRAM access and exiting the self-refresh state.

2. The method of claim 1, wherein the one or more selected commands include at least one of read (RD), write (WR), or precharge (PRE) commands received in the self-refresh state.

3. The method of claim 1, wherein the one or more selected commands are based on estimated durations of time for which the one or more selected commands need to activate the DRAM bank, relative to a function of a refresh interval of the DRAM bank.

4. The method of claim 1, comprising completing an internal refresh operation on the row of the DRAM bank and aborting the self-refresh state before another bank active command is allowed to access the DRAM bank.

5. The method of claim 1, comprising redirecting an internal refresh operation to a different DRAM bank.

6. The method of claim 1, further comprising measuring a traffic related to access of the DRAM bank and placing the DRAM bank in the self-refresh state if the traffic is light.

7. The method of claim 6, further comprising exiting the self-refresh state if a change in frequency of accessing the DRAM bank is indicated by an external command.

8. The method of claim 1, wherein the DRAM system is a low power dual-date rate (LPDDR) DRAM system.

9. A dynamic random access memory (DRAM) system comprising:
a DRAM controller configured to determine that a DRAM bank of the DRAM system is in a self-refresh state;
wherein the DRAM controller is configured to allow one or more selected commands to access the DRAM bank without exiting the self-refresh state;
wherein timing constraints are adjusted for refresh operations, to allow the one or more selected commands to access the DRAM bank without exiting the self-refresh state, the one or more selected commands based on estimated durations of time for which the one or more selected commands need to activate the DRAM bank, relative to a function of a refresh interval of the DRAM bank, and
wherein tRCD_SR is set as equal to tRCD+tSXR_abort, wherein tRCD is a wait time before a row of the DRAM bank is activated following a bank activate command received at the DRAM, tRCD_SR is a wait time before the row of the DRAM bank is activated based on the one or more selected commands while in the self-refresh state, and tSXR_abort is a time duration for aborting an ongoing DRAM access and exiting the self-refresh state.

10. The DRAM system of claim 9, wherein the DRAM controller is further configured to allow the one or more selected commands to access the DRAM bank without exiting the self-refresh state, based on one or more of a clock frequency, traffic conditions related to requests for accessing the DRAM bank, or a type of the one or more selected commands.

11. The DRAM system of claim 9, wherein the one or more selected commands include at least one of read (RD), write (WR), or precharge (PRE) commands received in the self-refresh state.

12. The DRAM system of claim 9, wherein the one or more selected commands are based on estimated durations of time for which the one or more selected commands need to activate the DRAM bank, relative to a function of a refresh interval of the DRAM bank.

13. The DRAM system of claim 9, wherein the DRAM controller is further configured to measure a traffic related to access of the DRAM bank and place the DRAM bank in the self-refresh state if the traffic is light.

14. The DRAM system of claim 13, wherein the DRAM controller is further configured to cause the DRAM bank to exit the self-refresh state if a change in frequency of access of the DRAM bank is indicated by an external command.

15. The DRAM system of claim 9, wherein the DRAM system is a low power dual-date rate (LPDDR) DRAM system.

16. The DRAM system of claim 9, integrated into a device, selected from the group consisting of a set top box, music player, video player, entertainment unit, navigation device, communications device, personal digital assistant (PDA), fixed location data unit, and a computer.

17. An apparatus comprising:
means for determining that a dynamic random access memory (DRAM) bank is in a self-refresh state; and
means for allowing one or more selected commands to access the DRAM bank without exiting the self-refresh state; and
means for adjusting timing constraints for refresh operations for allowing the one or more selected commands to access the DRAM bank without exiting the self-refresh state, comprising means for setting tRCD_SR as equal to least equal to tRCD+tSXR_abort, wherein tRCD is a wait time before a row of the DRAM bank is activated following a bank active command received at the DRAM bank, tRCD_SR is a wait time before the row of the DRAM bank is activated based on the one or more selected commands while in the self-refresh state, and tSXR_abort is a time duration for aborting an ongoing DRAM access and exiting the self-refresh state.

18. The apparatus of claim 17, further comprising means for selecting one or more commands as the selected commands allowed to access the DRAM bank without exiting the self-refresh state, based on one or more of a clock frequency, traffic conditions related to requests for accessing the DRAM bank, or a type of the selected commands.

19. The apparatus of claim 17, wherein the one or more selected commands include at least one of read (RD), write (WR), or precharge (PRE) commands received in the self-refresh state.

20. The apparatus of claim 17, further comprising means for measuring a traffic related to access of the DRAM bank and placing the DRAM bank in the self-refresh state if the traffic is light.

21. The apparatus of claim 17, further comprising means for causing the DRAM bank to exit the self-refresh state if a change in frequency of access of the DRAM bank is indicated by an external command.

22. The DRAM system of claim 9 comprising a mobile phone, wherein the mobile phone comprises the DRAM controller.

23. A dynamic random access memory (DRAM) system comprising:
   a DRAM controller configured to:
      measure a traffic related to access of the DRAM bank of the DRAM system and place the DRAM bank in a self-refresh state if the traffic is light; and
      while in the self-refresh state, allow one or more selected commands to access the DRAM bank without exiting the self-refresh state.

24. The DRAM system of claim 23, wherein the DRAM controller is further configured to cause the DRAM bank to exit the self-refresh state if a change in frequency of access of the DRAM bank is indicated by an external command.

25. The DRAM system of claim 23 comprising a mobile phone, wherein the mobile phone comprises the DRAM controller.

* * * * *